United States Patent [19]
Park

[11] Patent Number: 5,600,566
[45] Date of Patent: Feb. 4, 1997

[54] APPARATUS AND METHOD FOR MONITORING STATE OF BATTERY

[75] Inventor: Yong-Sik Park, Seongnam, Rep. of Korea

[73] Assignee: Samsung Heavy Industries Co., Ltd., Seoul, Rep. of Korea

[21] Appl. No.: 364,933

[22] Filed: Dec. 28, 1994

[30] Foreign Application Priority Data

Feb. 28, 1994 [KR] Rep. of Korea .................. 94-3791

[51] Int. Cl.⁶ ........................................................ H02J 7/04
[52] U.S. Cl. ........................ 364/481; 320/15; 320/43; 320/48; 340/636; 364/483
[58] Field of Search ........................... 320/15, 16, 17, 320/18, 43, 48; 340/636; 364/481, 483

[56] References Cited

U.S. PATENT DOCUMENTS

| | | | |
|---|---|---|---|
| 4,707,795 | 11/1987 | Alber et al. | 364/483 X |
| 4,823,086 | 4/1989 | Whitmire et al. | 324/434 |
| 4,885,523 | 12/1989 | Koenck | 320/43 X |
| 4,947,123 | 8/1990 | Minezawa | 320/48 X |
| 4,961,043 | 10/1990 | Koenck | 320/43 X |
| 5,206,578 | 4/1993 | Nor | 324/18 X |
| 5,278,487 | 1/1994 | Koenck | 320/43 X |
| 5,281,919 | 1/1994 | Palanisamy | 364/481 X |
| 5,321,627 | 6/1994 | Reher | 340/636 X |
| 5,498,950 | 3/1996 | Ouwerkerk | 320/18 |
| 5,530,337 | 6/1996 | Yamamoto | 320/18 X |

*Primary Examiner*—Edward R. Cosimano
*Attorney, Agent, or Firm*—Antonelli, Terry, Stout & Kraus, LLP

[57] ABSTRACT

An apparatus and a method for monitoring the state of a battery are disclosed in which a micro-processor is used to accurately measure the current state of a battery used for supplying electric power in electric automobiles and the like. The present invention includes: a plurality of passive modules with a micro-processor installed thereon for measuring the charge state of respective batteries; an active module for measuring the overall state of the batteries and for supervising the respective passive modules; and serial lines for connecting the passive modules and the active module. The passive modules compute the charge/discharge states of the respective batteries within certain time intervals to record the data into an internal RAM. The active module measures the overall charge/discharge state of the total batteries within certain time intervals, and receives the data on the charge/discharge states of the individual batteries through the serial communications. Then the active module compares these data to compute the overall battery residual capacity. With the present invention, the maintenance and wiring are easy to implement, and the exact time for charging the batteries can be known, thereby extending the life expectancy of the batteries.

2 Claims, 6 Drawing Sheets

Fig. 6

| Pack No. | Existence of defect | Charge state value | Temperature | Voltage | Current | Age | Direction of current | ..... | Remarks |
|---|---|---|---|---|---|---|---|---|---|
| 1 | | | | | | | | | |
| 2 | | | | | | | | | |
| ..... | | | | | | | | | |
| n | | | | | | | | | |

Fig. 7

| ACK | ID | REQ | Parmeter(s) | CS | EOT |

ID : Pack ID

REQ :  0 : Communication readied

1 : Readiness of communication completed

2 : Communication completed

4 : Communication abnormal

5 : Retransmission requested

6 : Pack parameters requested

7 : Charge carried out

8 : Discharge carried out

9 : System under the communication

Parameter :   existence of defects, Count, temperature, voltage, current, age ....

APPARATUS AND METHOD FOR MONITORING STATE OF BATTERY

BACKGROUND OF THE INVENTION

1. Field of the Invention

The present invention relates to an apparatus and a method for monitoring the state of a battery, in which a micro-processor is used to accurately measure the current state of a battery used for supplying electric power in electric automobiles and the like.

2. Description of the Prior Art

A conventional system for measuring the residual capacity of batteries is disclosed in U.S. Patent 4,823,086, and, in this invention, wires are used for measuring the charge state of individual batteries. However, in this case, the wiring is complicated, and therefore, the maintenance and replacement become a difficult problem.

Further, in this method, the residual capacity is computed by measuring the voltages and currents of the opposite terminals, regardless of the charge/discharge state of the batteries. Therefore, the computed result does not show the exact residual capacity. Further, the overall charge/discharge state is measured, and therefore, the charge/discharge state of the individual batteries cannot be known. Therefore, an inefficient charging may be carried out, or over-charging may be carried out for a part of the batteries.

Further, during the operation of the system, defective or malfunctioning batteries cannot be known.

SUMMARY OF THE INVENTION

The apparatus of the present invention includes: a plurality of passive modules with a micro-processor installed therein for measuring the charged state of respective batteries; an active module for supervising the respective passive modules and for measuring the overall charge/discharge state of the total batteries; and serial lines for connecting the plurality of the passive modules and the active module.

The plurality of passive modules compute the charge/discharge state of the respective batteries with certain time intervals to store the computed results into their own RAMs.

The active module measures the overall charge/discharge state of the batteries with certain time intervals.

Further, the active module is informed of the charge/discharge state of the respective batteries from the passive modules through serial communications. Then the active module makes comparisons and judgments to compute more exact residual capacities of the batteries.

Further, the active module supervises the charge/discharge states and the operational states of the respective batteries, and therefore, the active module provides a charge/discharge control function and a maintenance function:

The present invention overcomes the above described disadvantages of the conventional system.

Therefore it is the object of the present invention to provide an apparatus and a method for monitoring the state of each battery, in which a micro-processor is used for providing conveniently to the user by exact measurement the residual capacity of batteries, and for extending the life expectancy of the batteries by knowing the exact charge time.

In achieving the above object, the apparatus for monitoring the state of battery according to the present invention includes:

a plurality of passive modules including: an A/D converter for converting analog signals of the voltages, currents and temperatures of a plurality of batteries into digital signals within certain time intervals; a micro-processor for computing the charge state of the batteries based on the output of the A/D converter and a plurality of displays for displaying the battery charge state computed by the micro-processor;

an active module including: a micro-processor for computing the overall residual capacity of the batteries by obtaining information from the individual passive modules a storing means for storing the above information an auxiliary memory means for storing the information during the system-off a display for displaying the residual capacity of the plurality of the batteries; and two serial lines for connecting the passive modules and the active module.

In another aspect of the present invention, the method for monitoring the residual capacity of batteries according to the present invention is based on an apparatus including: a plurality of passive modules for measuring the charge state of the respective batteries an active module for measuring the overall residual capacity of the batteries; and two serial lines for connecting the plurality of the passive modules and the active module, the method including:

an individual battery charge state measuring step including the sub-steps of: checking the existence of any defectiveness of the batteries, converting the signals of the voltages, currents and temperatures into numeric signals by utilizing an A/D converter, and computing the charge state based on an already modelled charge/discharge function; computing the expected charge/discharge amounts based on the charge/discharge ratios for the respective batteries; comparing the expected charge/discharge amounts with the value obtained from the already modelled function so as to compute adjusted charge states, and storing the computed charge state values into an internal RAM; displaying the adjusted battery charge states through a display; and an overall battery charge state measuring step including the sub-steps of: converting analog information signals of the voltages, currents and temperatures of the total batteries into digital signals; polling the passive modules to collect information on any defectiveness, charge states, temperatures, voltages, currents and current directions, and storing these values into a RAM; computing the residual capacity of the batteries based on the values measured by the passive modules and based on the collected information values; comparing the respective measured values of the residual capacities with the computed values of the residual capacities so as to compute the overall residual capacity of the total batteries; and displaying the computed residual capacity through a display.

BRIEF DESCRIPTION OF THE DRAWINGS

The above object and other advantages of the present invention will become more apparent by describing in detail the preferred embodiment of the present invention with reference to the attached drawings in which:

FIG. 6 is a parameter table for the active module;

FIG. 7 illustrates the communication data format between the modules; and

DESCRIPTION OF THE PREFERRED EMBODIMENT

Figure 1:
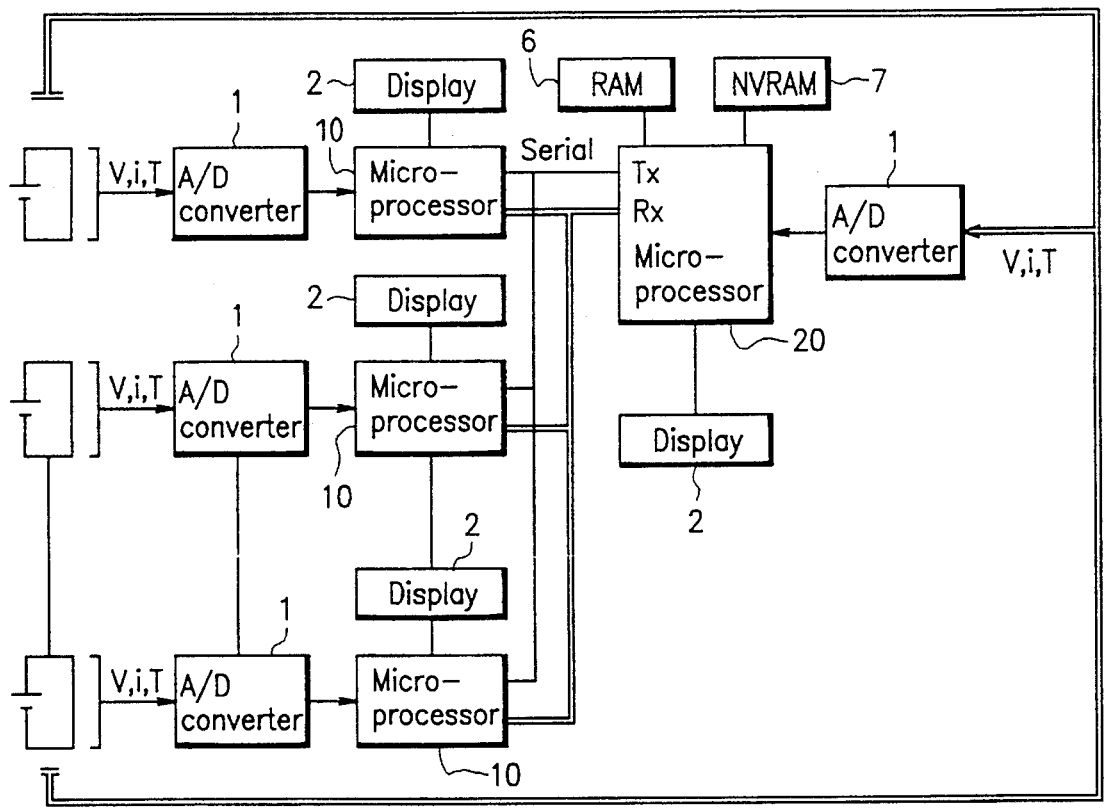
FIG. 1 is a block diagram showing the constitution of the present invention.

FIG. 1 is a block diagram showing the constitution of the present invention.

Figure 8:
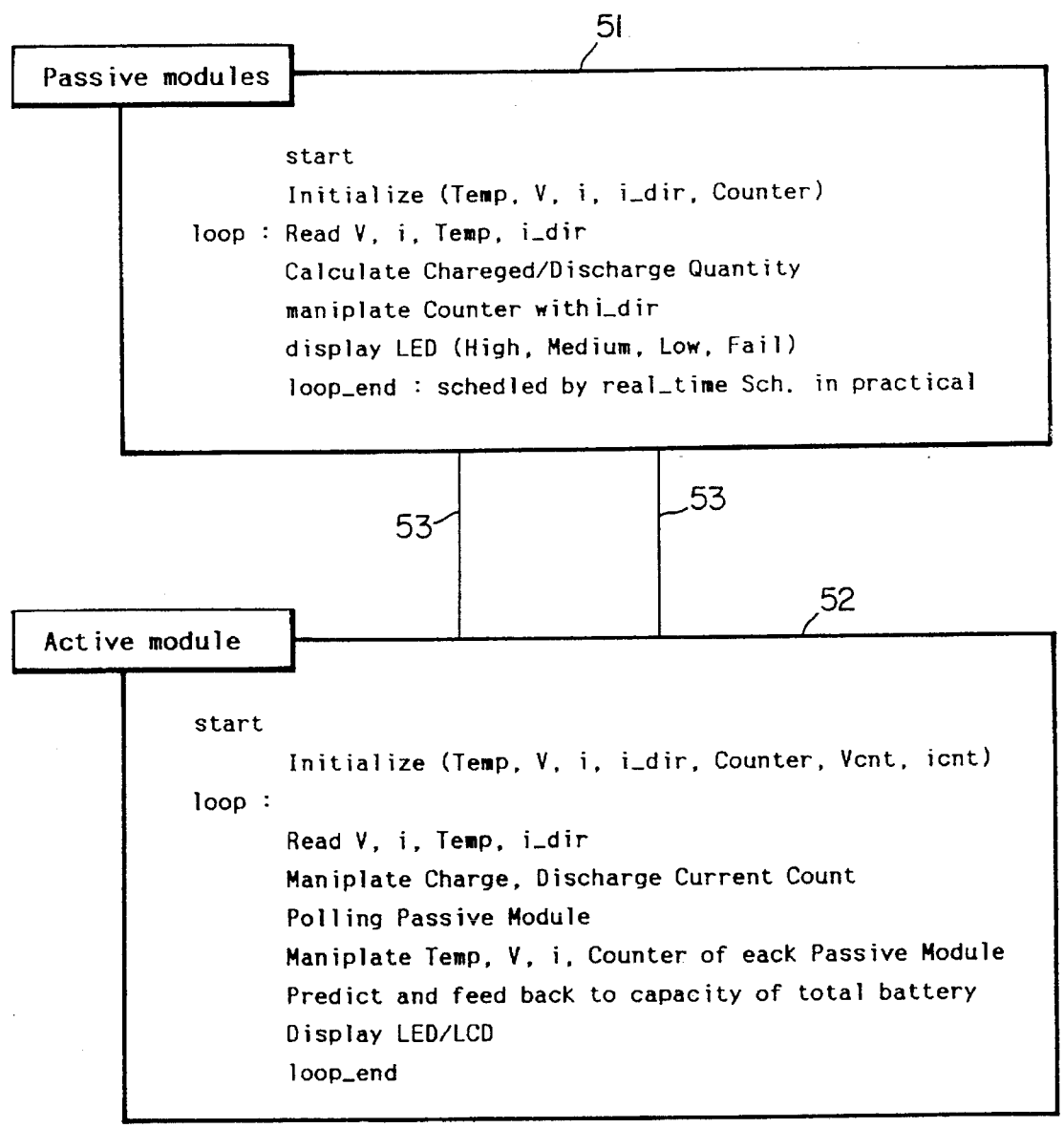
FIG. 8 is a flow chart for the operation pseudo code.

The present invention includes: a plurality of passive modules 51 with a micro-processor 10 installed therein for measuring the charge state of respective batteries; an active module 52 for measuring the overall state of the batteries and for supervising the respective passive modules; and serial lines 53 for connecting the passive modules and the active module as illustrated in FIG. 8.

Figure 3:
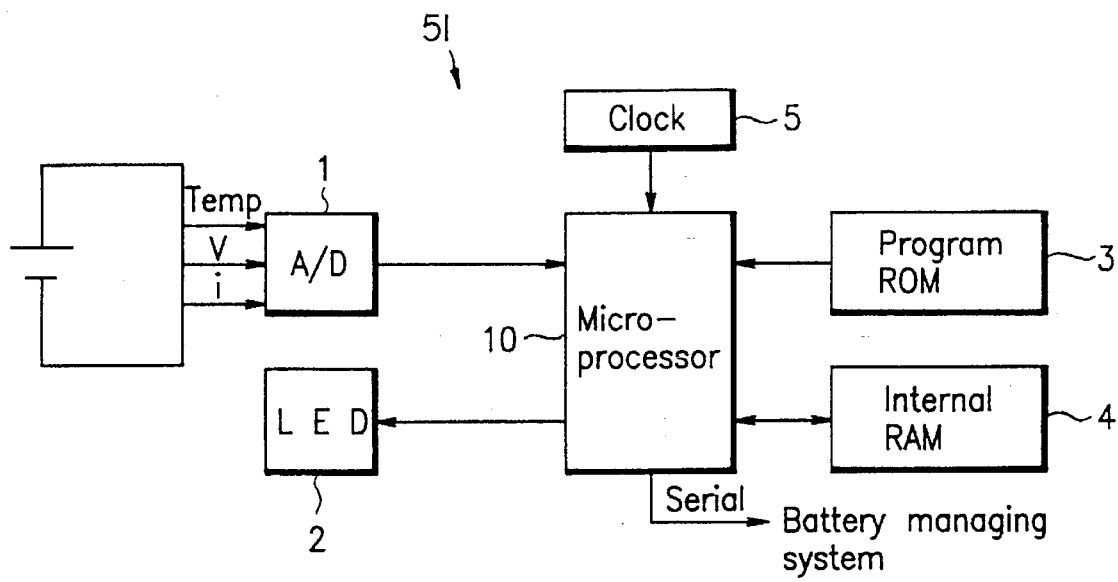
FIG. 3 illustrates the passive modules according to the present invention.

FIG. 3 is a block diagram showing the constitution of one of the passive modules for measuring the charge state of a single battery.

Figure 2:
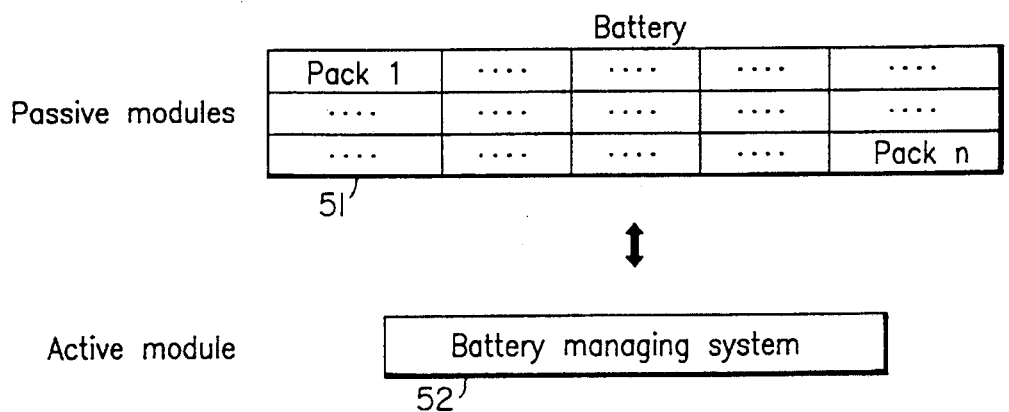
FIG. 2 illustrates the constitution of the modules according to the present invention.

FIG. 2 illustrates the arrangement of the passive modules and the active module in accordance with the present invention. The passive modules contain a battery with n packs.

That is, the passive module 51 includes: an analog/digital converter (A/D converter) 1 for converting analog signals of the voltages V, the currents i and the temperatures Temp of the individual batteries into digital signals with certain time intervals for inputting them into the micro-processor; a micro-processor 10 including an internal RAM 6, a program ROM 7, a clock 5 and a serial port, and for computing the charge state of the batteries based on the inputted information; and an LED as a display 2 for displaying the charge states of the respective batteries.

If the active module 52 requests data to the passive modules so as to be informed of the charge states of the respective batteries, then the passive modules transmit the required information through the serial lines to the active module.

Figure 4:
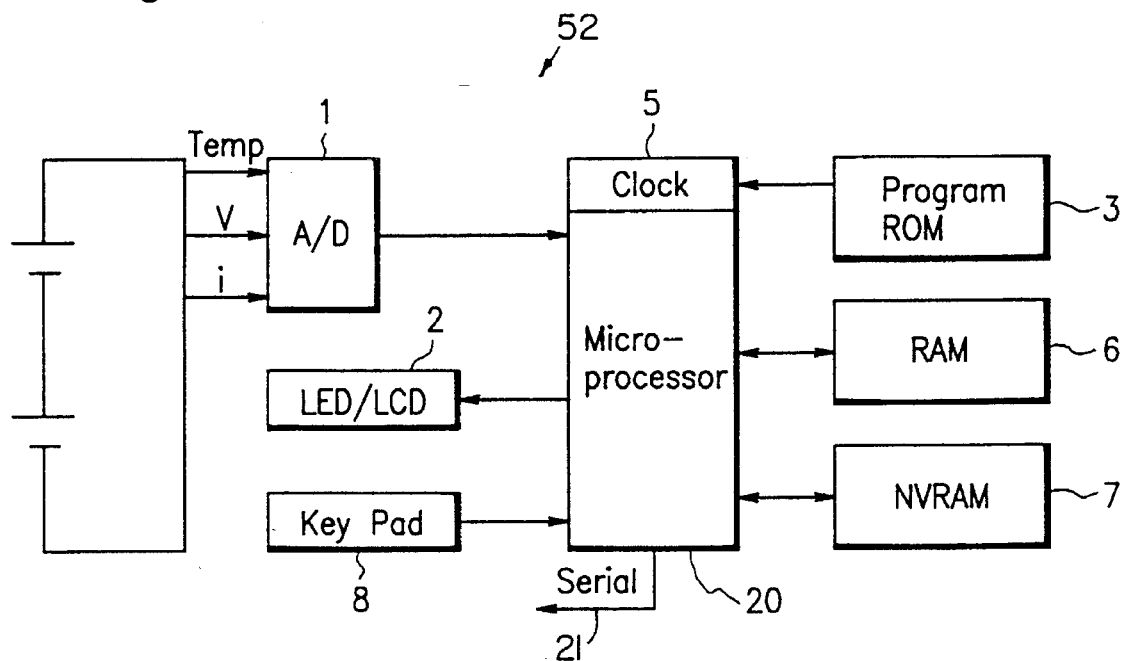
FIG. 4 illustrates the active module according to the present invention.

FIG. 4 is a block diagram showing the constitution of the active module 52.

The active module 52 measures the overall charge state of the total batteries, and receives the information on the charge state of the individual batteries from the passive modules, so that the residual capacity of the total batteries can be computed.

The active module 52 includes: an A/D converter 1 for A/D-converting the signals of the voltages, the currents and the temperatures of the total batteries; a program ROM 43; an internal ROM (not illustrated); a clock 5; a serial port 21; a micro-processor 20 for computing the overall residual capacity of the total batteries based on the information furnished by the above components; an external RAM 6 for storing the data of the passive modules; a nonvolatile RAM (NVRAM) 7 functioning as an auxiliary memory means for storing the information during the system-off; an LED/LCD display 2 for displaying the overall residual capacity computed by the micro-processor; and a key pad 8 for receiving key inputs from the external.

Thus the active module 52 receives the information on the charge states of the individual batteries from the passive modules 51 within certain time intervals. The active module compares these values with the overall charge state of the total batteries, thereby computing the overall residual capacity of the total batteries.

Figure 5:
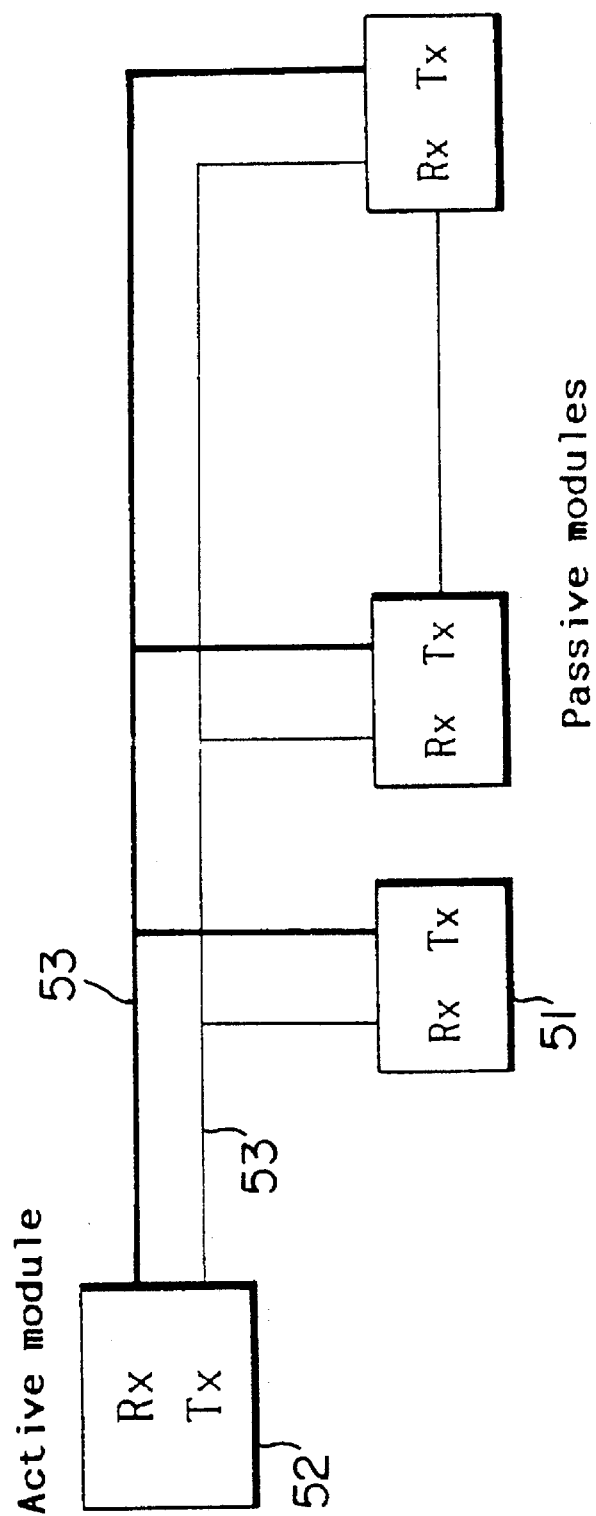
FIG. 5 is a block diagram showing the communications between the respective modules.

FIG. 5 is a block diagram showing the communications between the respective modules.

Now the present invention constituted as above will be described as to its specific operations.

Referring to FIG. 3, the plurality of the passive modules 51 check the defectiveness of the batteries within certain time intervals based on a timer which utilizes a clock and which is provided within the passive modules 51. Further, the passive modules 51 convert the analog signals of the voltages, the currents and the temperatures of the batteries into digital signals by utilizing the A/D converter 1. Based on an already modelled battery charge/discharge function, the charge states of the individual batteries are computed.

Under this condition, in accordance with the charge/discharge ratios of the batteries, the micro-processor 10 computes the expected charge/discharge amounts of the individual batteries, and compares these values with the values obtained based on the already modelled charge/discharge function, thereby computing adjusted charge values of the individual batteries.

In accordance with the magnitudes of the charge values of the respective batteries, the display 2 displays through LEDs of high, medium and low.

If one of the batteries is incapable of functioning, the LED displays FAIL.

Further, the plurality of the passive modules 51 record the existence of defectiveness, the voltages, the currents, the temperatures, the charge state value, the direction of the currents and the like into the internal RAM 4, and update them.

Further, if the charge/discharge of the batteries do not occur for a long time, or if the system is turned off, the micro-processor 10 detects it, and turns it to a power down mode, thereby minimizing the power consumption.

When the system is in a turned-on state, if charge/discharge operations occur or if the active module 52 requests data, then the micro-processor 20 detects it, and turns the system to the normal mode. Then the discharge amount until then and the power consumption under the power down mode are computed, thereby computing the charge states of the respective n batteries.

The active module 52 as shown in FIG. 4 converts the analog signals of the voltages, the currents and the temperatures of the batteries by utilizing the A/D converter 1 within certain time intervals by utilizing the clock of a timer which is internally installed. Thus, the overall residual capacity of the total n batteries is computed based on the already modelled battery charge/discharge function.

The micro-processor 20 subjects the passive modules 51 to polling. That is, it obtains the battery parameters such as the existence of defectiveness, the charge/discharge states, the temperatures, the voltages, the currents and the direction of the currents. Then it records the parameters into a passive module parameter table of the RAM 6 which is a memory means as shown in FIG. 6.

Then based on the parameters, the residual capacities of the batteries obtained from the passive modules are computed, and then, these values are compared with the residual capacities computed based on the already modelled battery charge/discharge function. Then the residual capacity thus adjusted is determined as the actual overall residual capacity of the total batteries, and this value is outputted to the display (LED/LCD) 2.

Meanwhile, in the case where the charges and discharges are being done, the measurement of the residual capacity of the batteries is carried out in the following manner. That is, the two kinds of the battery residual capacities as described above are compared with the expected overall residual battery capacity based on the charge/discharge ratio, and thus, the adjusted battery residual capacity is taken as the actual battery residual capacity. Then this value is displayed through the display.

FIG. 8 is a flow chart showing the operation of the passive modules and the active module, and FIG. 6 illustrates the arrangement of the parameters of the passive modules 51 which are supervised by the active module.

The communications between the passive modules 51 and the active module are done in the form of interrupts through the serial lines as shown in FIGS. 5 and 8.

Only when one communication with one of the passive modules 51 is completed, another communication with another of the passive modules can be started, while the passive modules cannot request for a communication to the active module 52 in an active manner.

The passive modules 51 respectively have an ID number, and therefore, as shown in FIG. 7, in accordance with the transmission data from the active module 52 the relevant passive module which has the corresponding ID number can respond to the request from the active module.

Further, the passive modules 51 record their own ID numbers in their response, and therefore, the communication consistency can be maintained.

As described above, conventionally wires are used for measuring the charge state of individual batteries, but this method is very complicated, with the result that the maintenance and replacement become very troublesome. However, according to the present invention, two serial lines 53 are used to check the charge state of batteries, and therefore, the maintenance and wiring are convenient in its actual application.

Further, the individual battery states are checked, and then, from it, the overall battery residual capacity is determined. Therefore the present invention provides an accuracy compared with the conventional method in which the opposite poles of the batteries are checked.

Further, the passive modules 51 display the charge state of the respective n batteries, and transmit the information to the active module 52 so that the information can be recorded in the battery pack parameter table located in the RAM of the active module 52, thereby making it possible to discriminate defective batteries.

Further, the respective battery states are checked, and the charge is controlled by taking the battery having the lowest performance as the a reference. Therefore, the life expectancy of batteries can be extended.

Further, the respective battery states are managed by the active module 52, and therefore, the optimum charge (high speed, intermediate speed and low speed chargings) and discharge are assured.

What is claimed is:

1. An apparatus for monitoring a battery charge state comprising:

a plurality of passive modules comprising an A/D converter for converting analog signals of voltages, currents and temperatures of a plurality of batteries into digital signals within time intervals, a micro-processor including an internal RAM, a ROM, a clock and a serial port for computing a battery charge state of the batteries based on an output of said A/D converter, and a plurality of displays for displaying the battery charge state of the batteries computed by said micro-processor;

an active module comprising a micro-processor for computing a residual capacity of the batteries by obtaining information from individual passive modules of said plurality of passive modules, a storing means for storing the information from said passive modules, an auxiliary memory means for storing the information from said passive modules when the apparatus is off, and a display for displaying the residual capacity of the plurality of the batteries; and two serial lines for connecting said plurality of passive modules and said active module.

2. A method for monitoring a residual capacity of a plurality of batteries with an apparatus including a plurality of passive modules for measuring a charge state of said plurality of batteries, an active module for measuring the residual capacity of the batteries, and two serial lines for connecting the plurality of passive modules and said active module comprising:

carrying out an individual battery charge state measuring step with said passive modules, including the sub-steps of checking an existence of any defective batteries, converting analog signals of voltages, currents and temperatures of the plurality of batteries into digital signals by utilizing an A/D converter, and computing a charge state based on an already modelled charge/discharge function, computing expected charge/discharge amounts based on charge/discharge ratios for respective ones of the plurality of batteries, comparing the expected charge/discharge amounts with a value obtained from the already modelled function so as to compute adjusted battery charge states, and storing computed charge state values into an internal RAM, and displaying the adjusted battery charge states with a display; and carrying out an overall battery charge state measuring step with said active module including the sub-steps of converting the analog signals of the voltages, currents and the temperatures of the plurality of batteries into digital signals, polling said passive modules to collect information on any defectiveness, charge states, temperatures, voltages, currents and current directions of the plurality of batteries, and storing the collected information in a RAM, computing the residual capacity of the plurality of batteries based on values measured by said passive modules and based on collected information values, comparing respective measured values of residual capacity of each battery with computed values of the residual capacity of each battery so as to compute the overall residual capacity of each of the plurality of batteries, and displaying the computed residual capacity of each of the plurality of batteries with a display.

* * * * *